(12) United States Patent
Lien et al.

(10) Patent No.: US 11,385,810 B2
(45) Date of Patent: Jul. 12, 2022

(54) DYNAMIC STAGGERING FOR PROGRAMMING IN NONVOLATILE MEMORY

(71) Applicant: SanDisk Technologies LLC, Addison, TX (US)

(72) Inventors: Yu-Chung Lien, San Jose, CA (US); Deepanshu Dutta, Fremont, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 17 days.

(21) Appl. No.: 16/916,620

(22) Filed: Jun. 30, 2020

(65) Prior Publication Data
US 2021/0405891 A1   Dec. 30, 2021

(51) Int. Cl.
*G06F 3/06* (2006.01)
(52) U.S. Cl.
CPC .......... *G06F 3/0625* (2013.01); *G06F 3/0634* (2013.01); *G06F 3/0659* (2013.01); *G06F 3/0679* (2013.01); *G06F 2212/1028* (2013.01)
(58) Field of Classification Search
CPC .... G06F 3/0625; G06F 3/0634; G06F 3/0679; G06F 3/0659; G06F 12/0246; G06F 2212/1028; G06F 2212/7208; G06F 1/206; G06F 1/3287; G06F 1/329; G11C 5/14–148; G11C 8/18
See application file for complete search history.

(56) References Cited

U.S. PATENT DOCUMENTS

| | | | |
|---|---|---|---|
| 2016/0077961 A1* | 3/2016 | Erez | G06F 1/3275 |
| | | | 711/103 |
| 2018/0268881 A1* | 9/2018 | Sugahara | G11C 7/1063 |
| 2019/0079697 A1* | 3/2019 | Suzuki | G06F 3/0679 |
| 2019/0114099 A1* | 4/2019 | Jeon | G06F 3/0688 |
| 2019/0121725 A1* | 4/2019 | Sehgal | G06F 12/0246 |
| 2020/0042238 A1* | 2/2020 | Jung | G06F 3/0679 |
| 2020/0104062 A1* | 4/2020 | Cho | G06F 3/0619 |
| 2021/0055772 A1* | 2/2021 | Guo | G11C 5/14 |
| 2021/0166771 A1* | 6/2021 | Jung | G11C 16/3459 |

* cited by examiner

*Primary Examiner* — Reginald G Bragdon
*Assistant Examiner* — Curtis James Kortman
(74) *Attorney, Agent, or Firm* — Dickinson Wright PLLC; Steven C. Hurles

(57) ABSTRACT

An apparatus includes a controller and a plurality of memory dies operable connected to and controlled by the controller. Each of the memory dies draws a current from a current source during a program operation. The controller being configured to receive a clock signal from each of the memory dies; count the number of clock signal received to determine a count value; and dynamically stagger at least one of the memory dies relative to the other memory dies when the count value reaches a maximum count value within a threshold time. The controller operates to dynamically stagger operation of at least one memory die to prevent the group of memory dies from operating synchronously.

18 Claims, 12 Drawing Sheets

DYNAMIC STAGGERING FOR PROGRAMMING IN NONVOLATILE MEMORY

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. The need for greater memory energy consumption and use during operation of memory devices is a consideration for design.

SUMMARY

Various embodiments are described herein for operating a nonvolatile memory, e.g., a NAND, a BICOS memory or the like. The memory can be operated to reduce the likelihood that a current draw in the system during operation of a memory device will exceed a maximum current. The memory controller can dynamically stagger the operation of the memory dies under certain detected operations to avoid synchrous operation of the memory dies, e.g., during a current intensive operational stages. This may operate to reduce the likelihood or prevent exceeding the maximum current value available to the group of memory times operably connected to the memory controller.

In an example embodiment, an apparatus includes a controller and a plurality of memory dies operable connected to and controlled by the controller, wherein each of the memory dies draws a current from a current source during an operation. The operation can be a programming operation. The controller is configured to: receive a clock signal from each of the memory dies; count the number of clock signal received to determine a count value; and dynamically stagger at least one of the memory dies relative to the other memory dies when the count value reaches a maximum count value within a threshold time.

In an example embodiment, the control circuit is configured to reset the count to zero when the threshold time expires.

In an example embodiment, the control circuit is further configured to restart a timer counting the threshold time when a new clock signal is received.

In an example embodiment, the timer count starts at the threshold time and counts down to zero.

In an example embodiment, the control circuit is further configured to determine a loop count to determine if the number of times the plurality of memory dies have loped through a programming operation.

In an example embodiment, the control circuit compares the loop count versus a minimum loop value and a maximum loop value, and the loop count must be between or equal to one of the minimum loop value and the maximum loop value to trigger dynamic staggering.

In an example embodiment, the control circuit is further configured to receive a loop value from each memory die and the clock signal over a communication bus.

In an example embodiment, the maximum count value is equal to a number of the plurality of memory dies.

In an example embodiment, the clock signal is RR1 for a first overhead time or RR5 for a second overhead time and the first overhead time is longer than the second overhead time.

In an example embodiment, the control circuit is configured to dynamically stagger a first memory die and a second memory die of the plurality of memory with a first delay for the first memory die and a second delay for the second memory die with the first delay being different than the second delay.

A dynamic staggering method for nonvolatile memory is disclosed herein, the method may use the apparatuses described in this summary or elsewhere in the present document. In an example, the method includes receiving a clock signal, at a memory controller operably connected to the plurality of memory dies, that indicates an current intensive operation at the plurality of memory dies; starting a timer upon receipt of a first clock signal from a first memory die of the plurality of memory dies; counting a number of clock signals received within a threshold time of the timer; determining if the counted number of clock signals exceeds a maximum count; if the counted number of clock signals does not exceed the maximum count, allow the memory dies to continue with scheduled operation; and if the counted number of clock signals exceeds the maximum count, dynamically stagger operation of at least one of the plurality of memory dies to prevent synchronous operation of the plurality of memory dies.

In an example embodiment, the method further comprises resetting the counting of the number of clock signals to zero when the threshold time expires.

In an example embodiment, the method further comprises starting the timer includes starting the timer at the threshold time and counting down to zero.

In an example embodiment, the method further comprises determining a loop count for the individual dies to determine the place in a timed operation of the memory dies.

In an example embodiment, the method further comprises determining the loop count further includes comparing the loop count versus a minimum loop value and a maximum loop value and the loop count must be between or equal to one of the minimum loop value and the maximum loop value to trigger dynamic staggering.

In an example embodiment, the method further comprises receiving the clock signal includes receiving a RR1 clock signal for a first overhead time or a RR5 clock signal for a second overhead time and the first overhead time is longer than the second overhead time.

In an example embodiment, a circuit for operating a plurality of memory dies is provided. The circuit includes a bus which is configured to connect with a plurality of memory dies and wherein a clock signal can be received via the bus from each of the memory dies. The circuit is further configured to count the number of clock signals received to determine a count value and communicate a signal via the bus to dynamically stagger at least one of the memory dies relative to the other memory dies when the count value reaches a maximum count value within a threshold time.

In an example embodiment, the circuit is further configured to reset the count to zero when the threshold time expires.

In an example embodiment, the circuit is further configured to restart a timer counting the threshold time when a new clock signal is received.

In an example embodiment, the timer count starts at the threshold time and counts down to zero.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Apparatuses and techniques are described for controlling the program operations of memory dies to reduce the likelihood or prevent a current draw that exceeds a current supply capacity or maximum current draw from the current source. In an example, the memory dies are controlled by a same controller and draw current from a same current source. The current source can be part of the controller. The controller can dynamically shift operation of one or more memory dies such that a maximum current draw is not exceeded.

Figure 1:
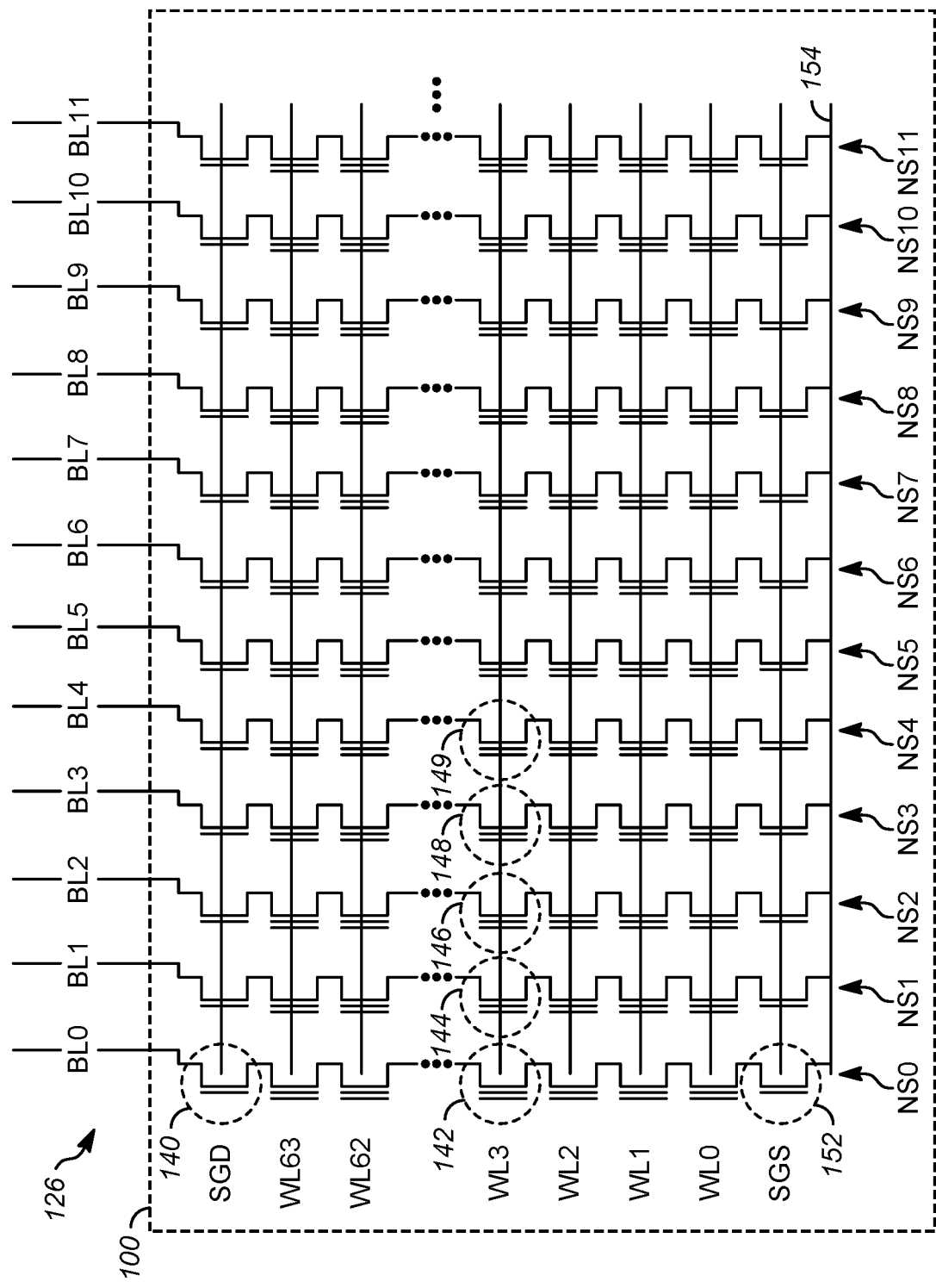
FIG. 1 illustrates an embodiment of an array of memory cells including bit and word lines according to an example embodiment.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty-word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
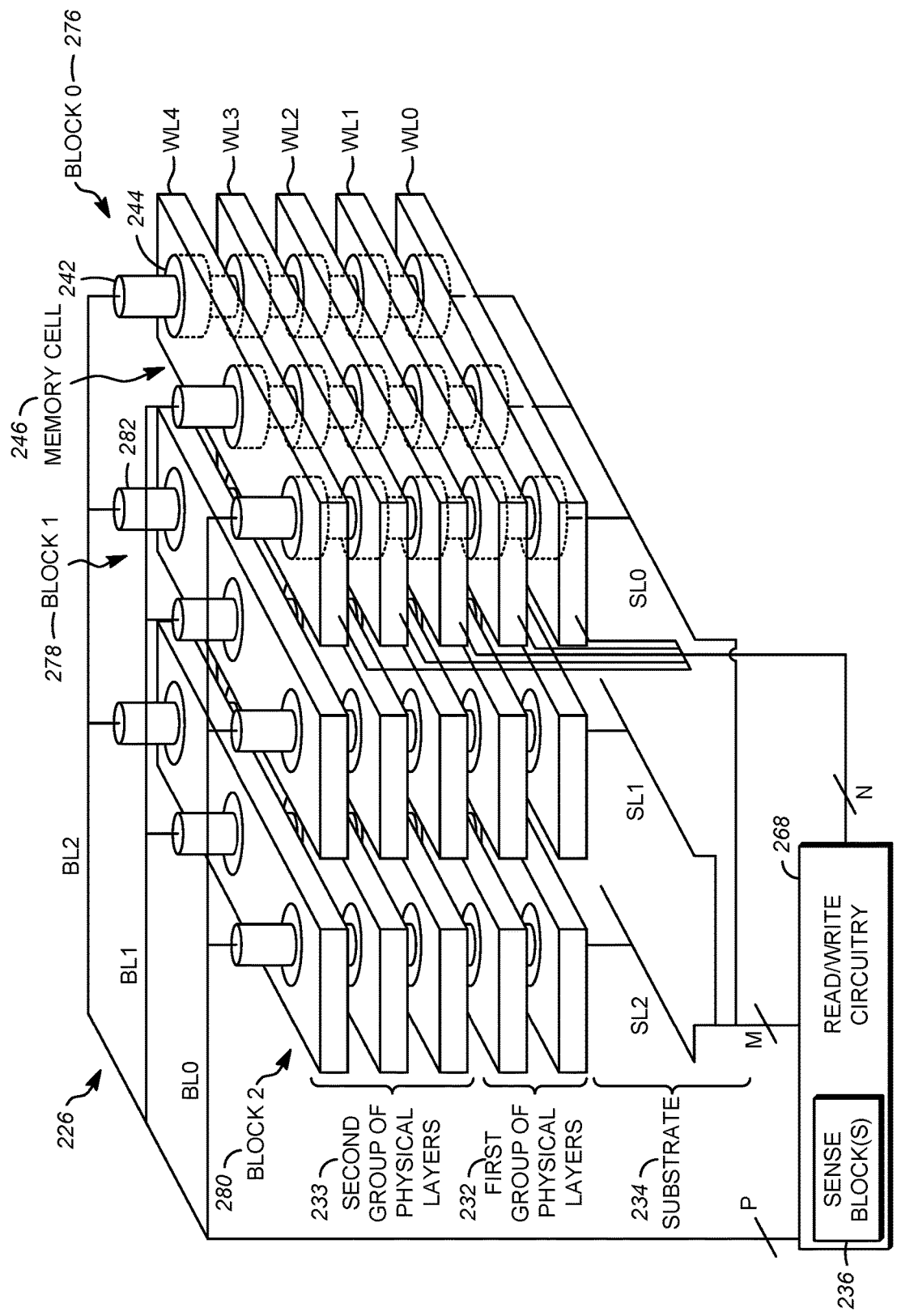
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4).

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
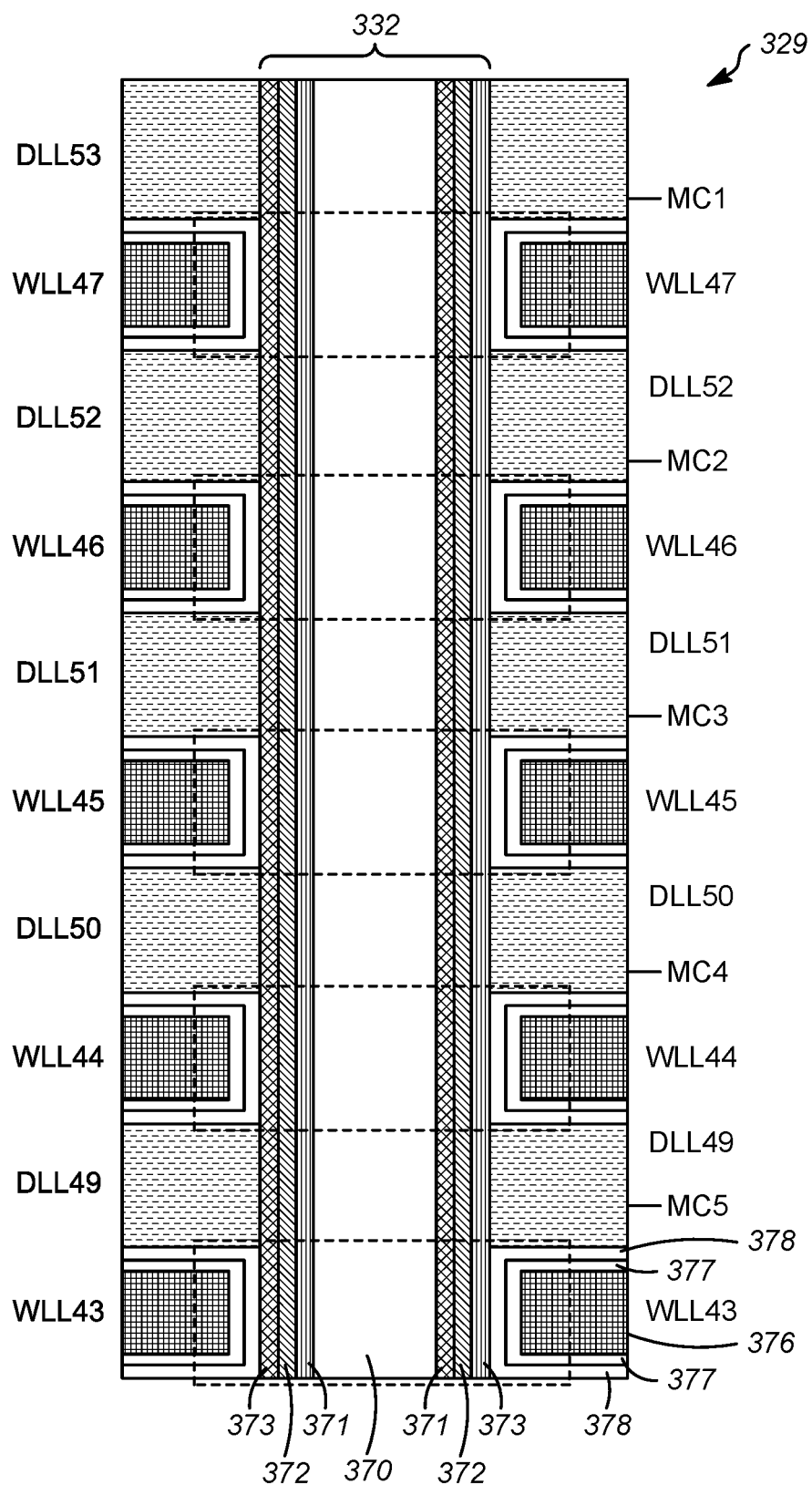
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
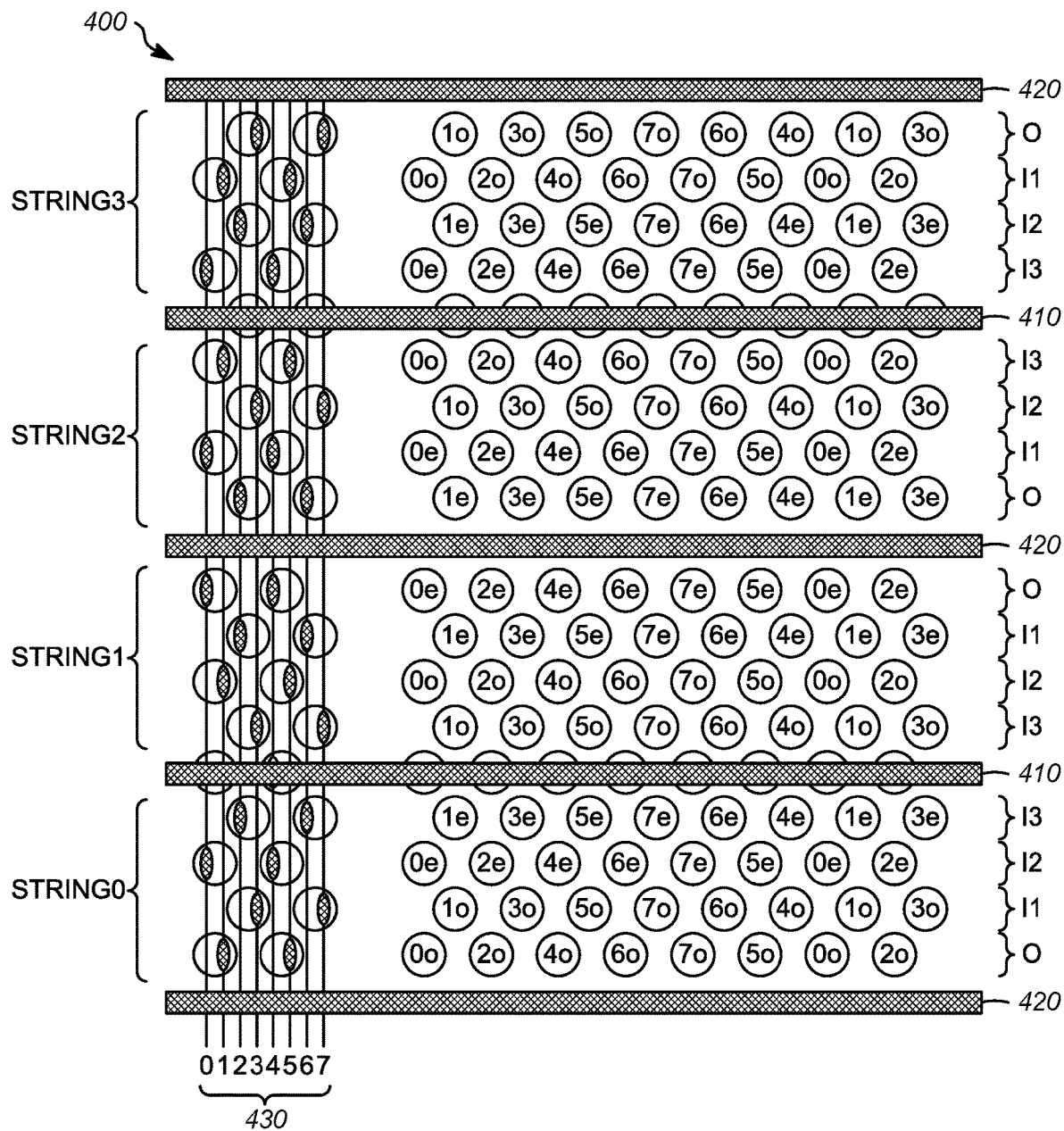
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410, and a deep etching feature 420. The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
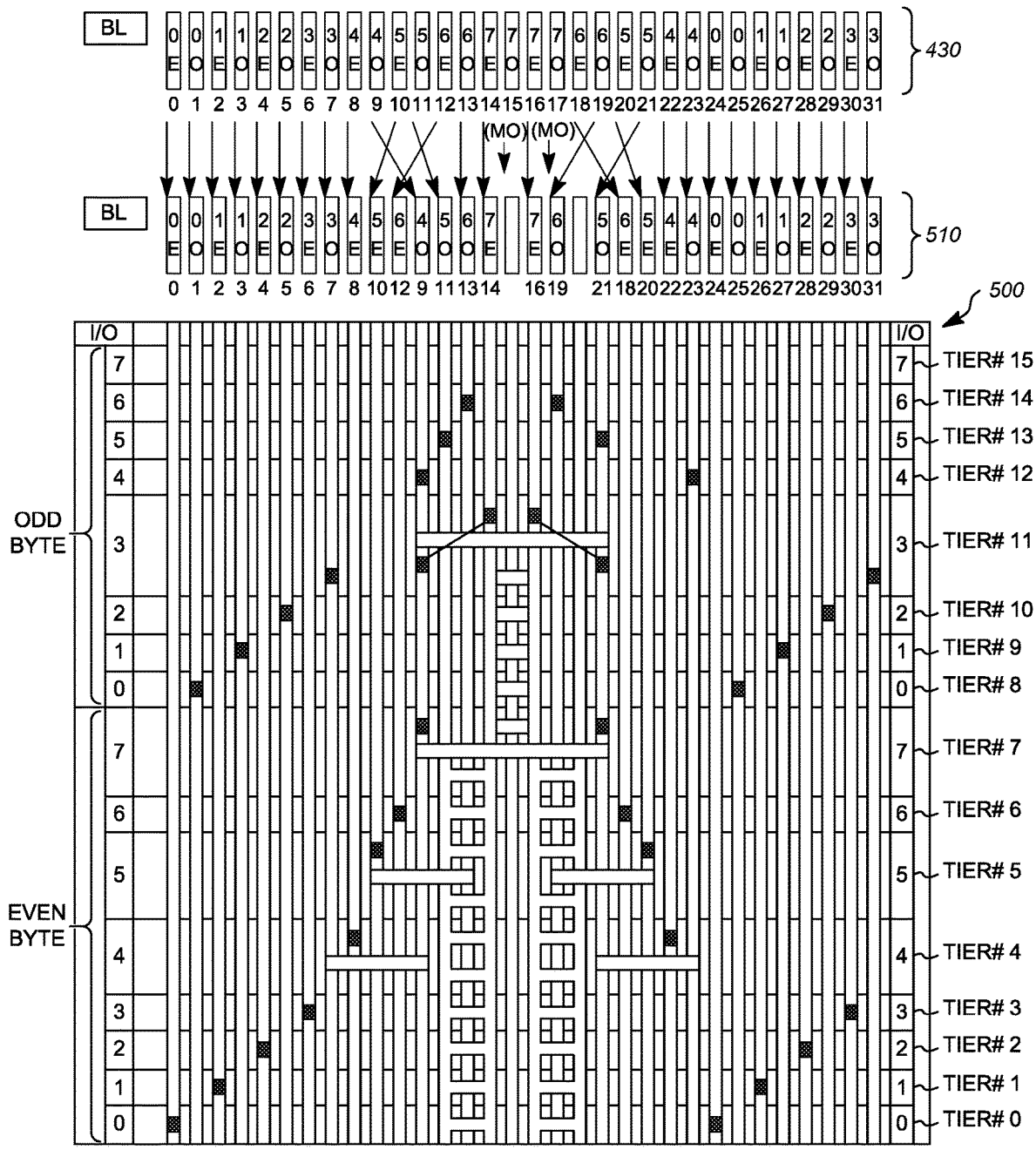
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like. Thus, while "subgroup of memory cells" is one term that may be used to refer to a subset of memory cells, any of these terms (i.e., "subgroup," "memory cell subgroup," "tier," "tier group," "IO group," "division," etc.) can be interchangeably used throughout the present disclosure.

Figure 6:
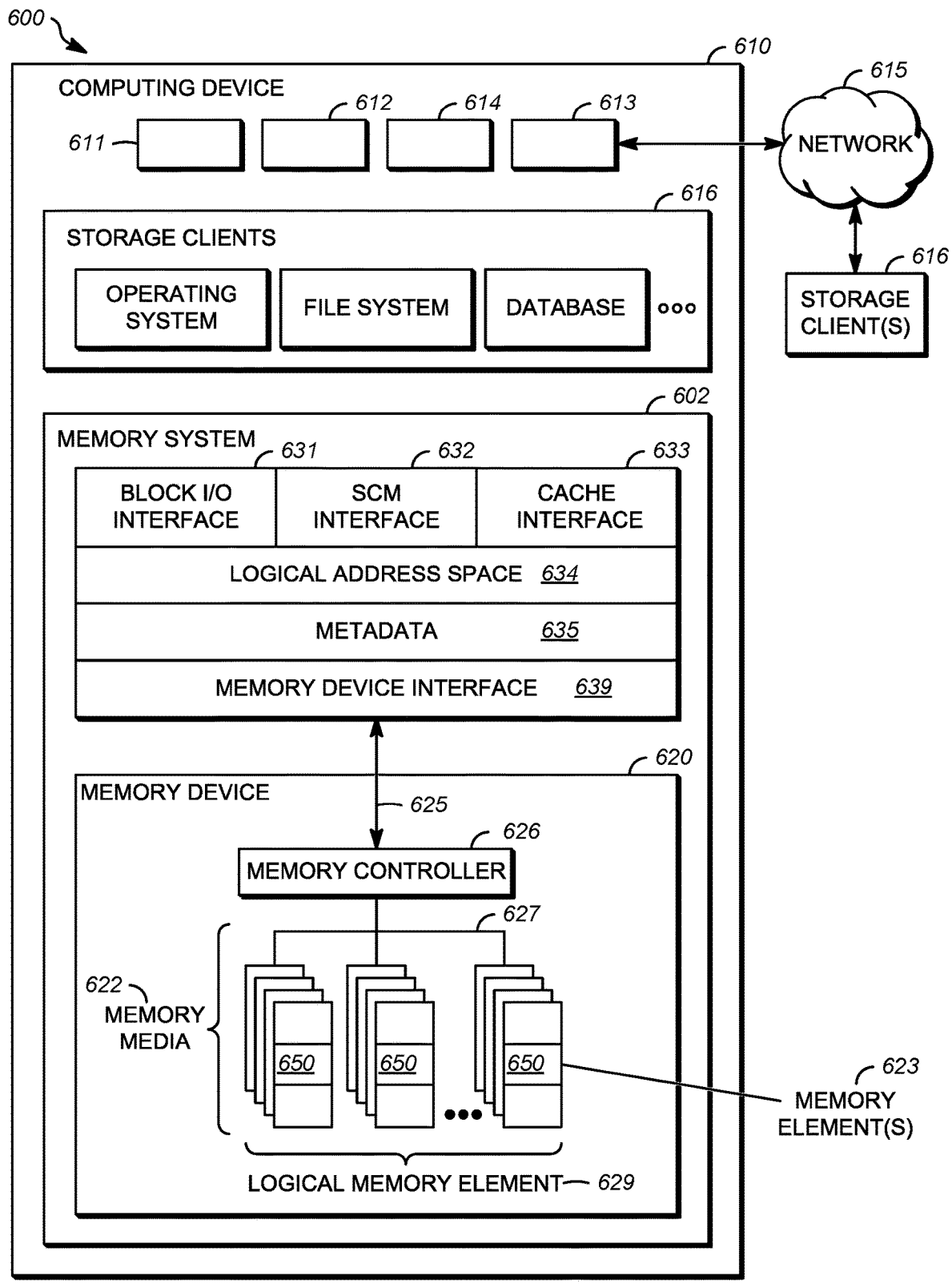
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or subgroup selection circuits 650 for memory media 622 of a non-volatile and/or volatile memory device 620. As used herein, an "subgroup selection circuit" refers to a circuit utilized to identify a programming speed for a subgroup of memory cells (e.g., an IO group or a tier group of memory cells) in relation to at least one other subgroup of memory cells and select the identified subgroup of memory cells for use in at least one programming operation. A subgroup selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

In an embodiment, a subgroup selection circuit 650 can be disposed at or toward an edge and/or peripheral of a memory element 623, adjacent and/or next to an array of memory media 622 (e.g., as depicted in FIG. 6). In a further embodiment, a subgroup selection circuit 650 can be disposed on a different level, layer, and/or plane of an integrated circuit device than an array of memory media 622 (e.g., as CMOS or other circuit under the array, parallel with and offset from the array, or the like).

In an embodiment, the slowest subgroup for each string (e.g., four subgroups per string) can be selected for program verify operations to make sure that each page is sufficiently programmed. In other embodiments, the fastest subgroup for each string can be selected for certain program operations in order to avoid over programming issues, as previously discussed. Depending on the manufacturing process used, the outer IO group is often the slowest subgroup and, in some embodiments, can be the default setting. However, due to process variations, word line dependencies, string dependencies, degradation, etc., sometimes the inner3 IO group, or another IO group, may be the slowest subgroup, as previously discussed. If the outer IO group is used but the inner3 IO group is slower, it can cause a lower tail issue for a highest data state (or for other states) where certain memory cells may not be sufficiently programmed, causing data errors.

A subgroup selection circuit 650, in certain embodiments, can determine if a number of memory cells for a plurality of subgroups (e.g., an outer IO group, an inner1 IO group, an inner2 IO group, and an inner3 IO group, exceed an A state program verify level (and/or another predefined verify level) during an A-verify program operation. As used herein, a verify or verification level can refer to any level associated with a particular state that may be reached during programming or erasing of a memory cell. The subgroup selection circuit 650 can accomplish this by scanning (or counting) the number of bits (where each bit corresponds to one memory cell) that exceed the A state program verify level. A pre-determined threshold number of bits can also be chosen (e.g., 100 bits). In an embodiment, the pre-determined threshold is exceeded before the subgroup selection circuit 650 performs the next operation. For example, if it is determined that the number of memory cells (e.g., bits) that exceed the A-verify level (a programming threshold for the lowest state in a memory cell) satisfies a numeric threshold, then the subgroup selection circuit 650 can count the number of bits for each individual subgroup above the programming threshold in order to determine which subgroup is the fastest subgroup and/or which subgroup is the slowest based on which subgroup has a greatest number of bits that exceed the A-verify level, and which subgroup has a least number of bits that exceed the A-verify level. Thereafter, the identified fastest and/or slowest subgroup subgroups can be used in a programming operation to represent all other IO groups, as previously discussed. For example, the identified slowest subgroup can be used to perform a program verify operation that is representative of all other subgroups for a whole page programming operation. In this manner, the time it takes to perform a program verify operation for a whole page programming procedure will be greatly reduced, while at the same time mitigating errors due to under programming.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an mode, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infiniband, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
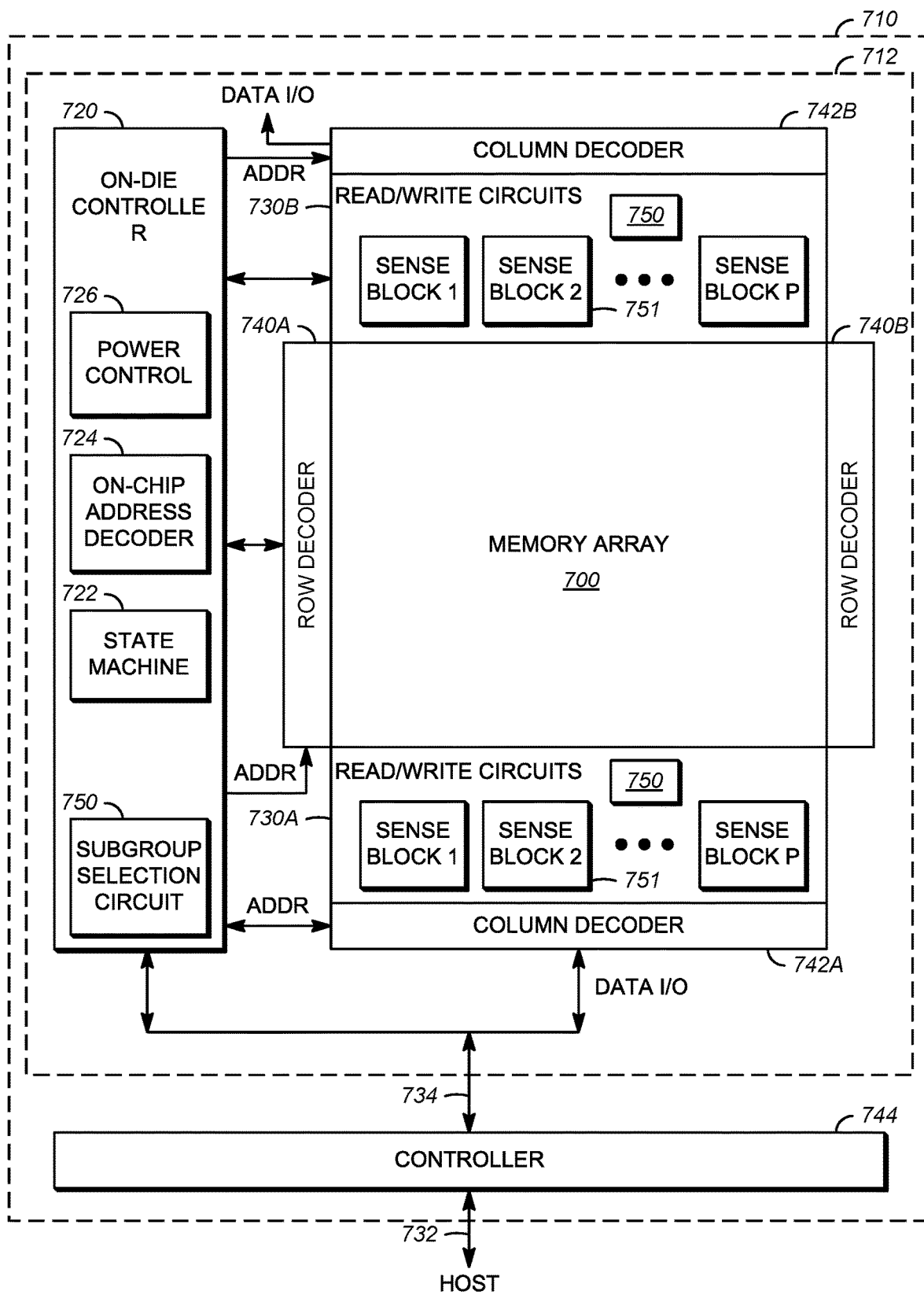
FIG. 7 illustrates a schematic block diagram of non-volatile storage device for memory cell subgroup identification and selection.

FIG. 7 is a schematic block diagram illustrating an embodiment of a non-volatile storage device 710 for memory cell subgroup identification and selection. The non-volatile storage device 710 can include one or more memory die or chips 712, with one or more subgroup selection circuits 750. These subgroup selection circuits 750 may perform the same functions and variation discussed in connection with the subgroup selection circuits 650 of FIG. 6. A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6. While the one or more subgroup selection circuits 750 of FIG. 7 are depicted toward a periphery of the memory die or chip 712 (e.g., on a same physical level as the memory array 700 in an integrated circuit device), in other embodiments, one or more subgroup selection circuits 750 can be disposed on a different physical level of the memory die and/or chip 712 than the memory array 700 (e.g., parallel to and offset from a level of the memory array 700 in an integrated circuit device). In one embodiment, a subgroup selection circuit 750 can be part of an on-die controller 720. In a further embodiment, a subgroup selection circuit 750 can be part of read/write circuits 730A-B, a row decoder circuits 740A-B, a column decoder circuits 742A-B, or the like.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, and a power control circuit 726. In one embodiment, the on-chip address decoder 724 and/or the power control circuit 726 can be part of and/or controlled by the controller 744.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits.

Figure 8:
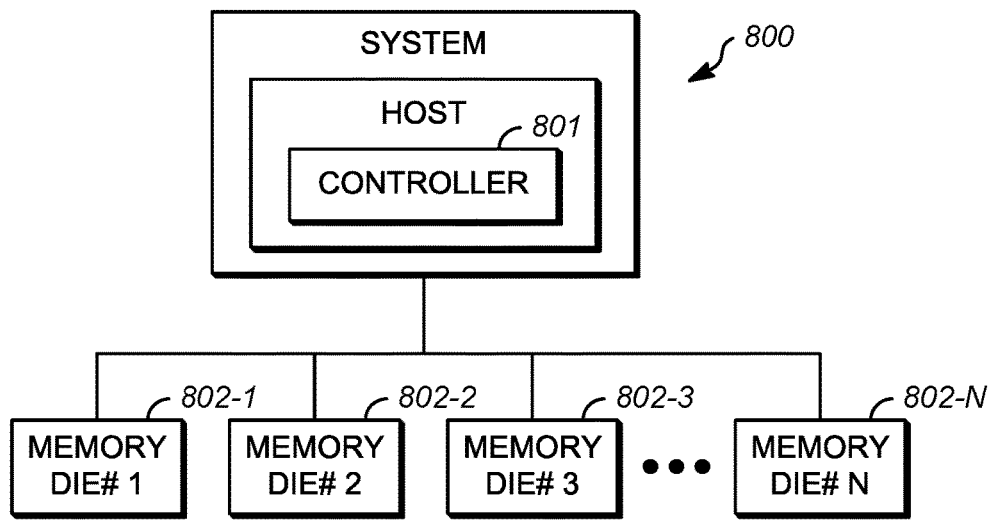
FIG. 8 illustrates a schematic block diagram of a controller and a plurality of memory dies according to an example embodiment.

FIG. 8 shows a memory sub-system 800 with system controller 801 that interacts with the host device and controls multiple memory dies 802-1, 802-2, 802-3, . . . 802-N. In an example embodiment the number of memory dies is a factor of two, e.g., eight or more, 16, 32. The memory dies 802 contain nonvolatile memory cells, e.g., NAND memory cells as described herein, on-die control circuitry, and I/O latches. A communication bus 803 transmits electrical signals between the controller 801 and the memory dies 802. The communication bus 803 can transmit data bits to and from the memory dies 802. The communication bus 803 can transmit data bits representing the state of the memory dies, e.g., a single bit representing the RR1 timing state of any of the memory dies. The memory dies 802 can output the specific clock signals, e.g., RR1 clock, RR5 clock, or previous R clock, if necessary.

The clock referred to on some embodiments refer to the clock signals used in various operations on the memory dies. For a MLC operation of a NAND nonvolatile memory, the R_CLK, IQPW_CLK, RWL_CLK, RR_CLK, P_CLK, PO_CLK, and PR_CLK signal sections may be used. Overall program operation has several program pulses (e.g., fourteen loops). Each loop has one program pulse and followed by one or several program verify operation. Peak Icc at each memory die occurs during inhibit BL ramping. (P5 or RR6 depending on parameter DYNAMIC_INH). The peak current increases when programming loop increases to a half of total programming loop and then decreases till the end of program operation. It may be difficult to predict the verify number for each program loop before the whole program operation starts. However, after each program pulse, the memory controller (e.g., a NAND controller) is notified the verify count by a signal from the memory die. Moreover, when a NAND memory die enters RR clock, the occurrence of peak Icc is fixed in time thereafter.

Figure 9A:
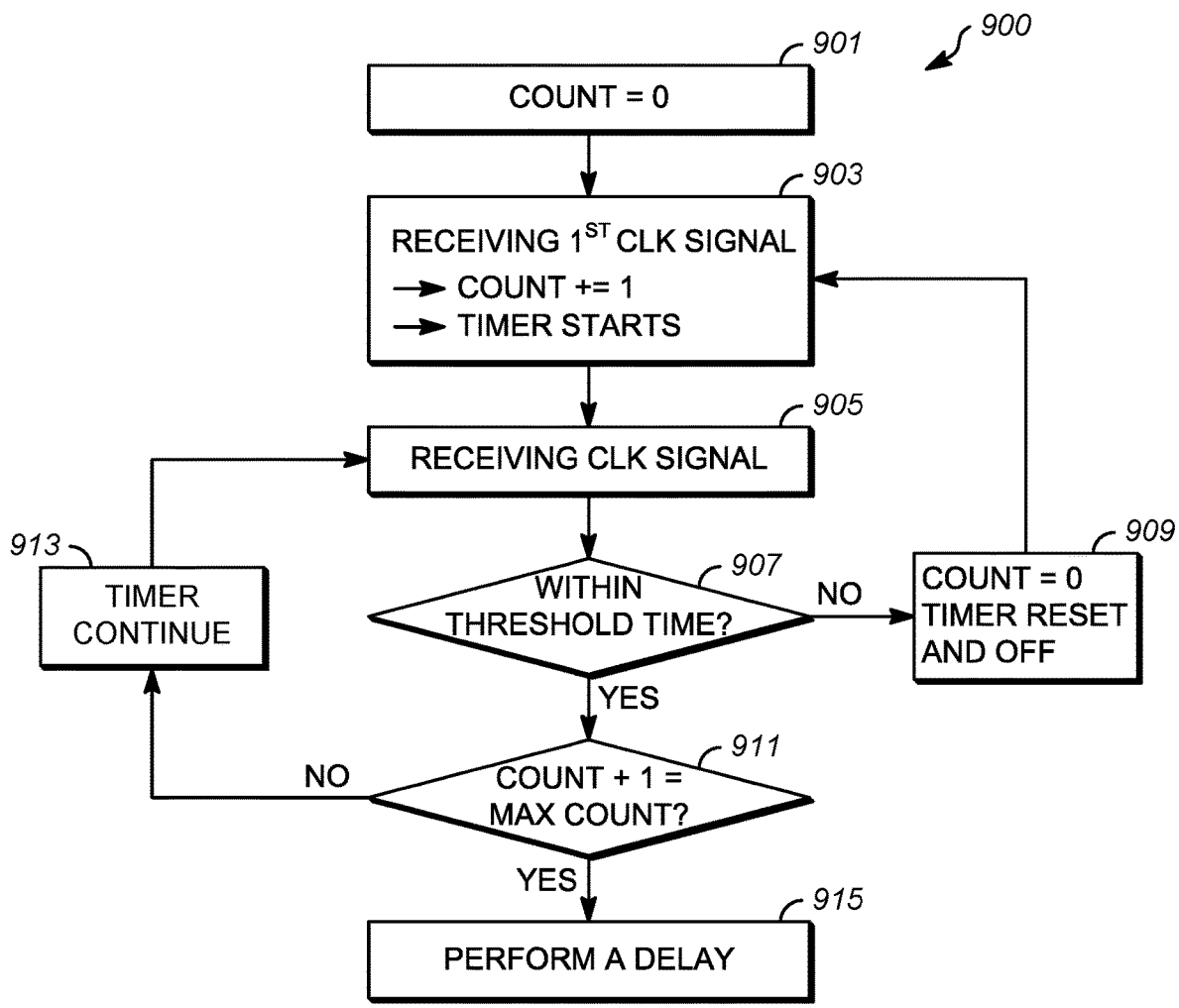
FIG. 9A depicts a flow chart for determining whether die program staggering is needed according to an example embodiment.

FIG. 9A shows a process flow 900 for determining if the memory controller should trigger a dynamic staggering of the operations of the memory dies under control of the memory controller. This can be performed using counts of the feedback digits from the memory dies to determine if the dies are in synch such that they will draw current in excess of the maximum current the memory controller can provide to the memory dies over a certain time period. These process flows can be performed on the memory sub-system of 800 or the memory systems described with reference to FIGS. 1, 6 and 7.

At 901, the memory controller sets its count value in a counter to zero. This is done for a new state of the memory controller representing new commands being sent to the memory dies. The count value is stored internally in the memory controller. The count value represents the number of memory dies that will perform a certain function. The timer is used so that the certain functions be counted in the counter must occur within a certain time period in order to trigger dynamic staggering of the operation(s) of the memory dies to prevent exceeding the maximum current draw from the memory controller or the maximum current available to the memory dies over a certain time period.

The timer counts down the time remaining in the threshold time value. This time value is set based on the plateau of the current peak. The plateau is defined as a width of current peaks that when summed together would exceed the maximum current value. The threshold time can be about 2.0 µseconds. It has been shown that the peak current at the memory dies has the width in the time domain.

At 903, the memory controller continually receiving the clock input signals from the memory dies. When the clock input is received, the memory controller starts a timer and increments the internal counter by one.

At 905, the memory controller continues to receive clock signal input from the memory dies after timer has started. These clock signals will represent various actions by the memory die(s).

At 907, the memory controller determines if the new received clock input signal is received within threshold time value. The threshold time value can be stored in the memory controller and programmed based on experimental values. If the new clock signal value is not received within the threshold time value, the process moves to step 909. If the clock input value is with the threshold time, the process moves to step 911.

At 909, the timer is reset and deactivated until the next received clock input value is received. The count is reset to zero.

At 911, the internal counter is incremented by one and a determination is made if the count is equals to a stored max count number. The maximum count value is the maximum number of dies that are performing a certain operation, e.g., programming, before the maximum current value is exceeded. For example, for some NAND system if eight memory dies are all performing a programming operation at the same time and that would exceed the maximum current value, then the max count is set to eight. If only seven memory dies need to be performing the same operation to exceed the maximum current value, then the max count value is set to seven. If not, the process moves to step 913 and the timer continues to run and the memory controller await to receive more clock input values at step 905. If yes at step 911, then the process moves to step 915.

At 915, the memory controller triggers dynamic staggering of the operations in the memory dies. In an example, at least one memory die is instructed to delay its action relative to another memory die is performed.

This process allows the memory sub-system to operate at a usual speed and normal order of operation, i.e., no delays to prevent violation of maximum current value available to the memory dies. This process also does not require a static staggering of operation, which always occurs and degrades performance.

Figure 9B:
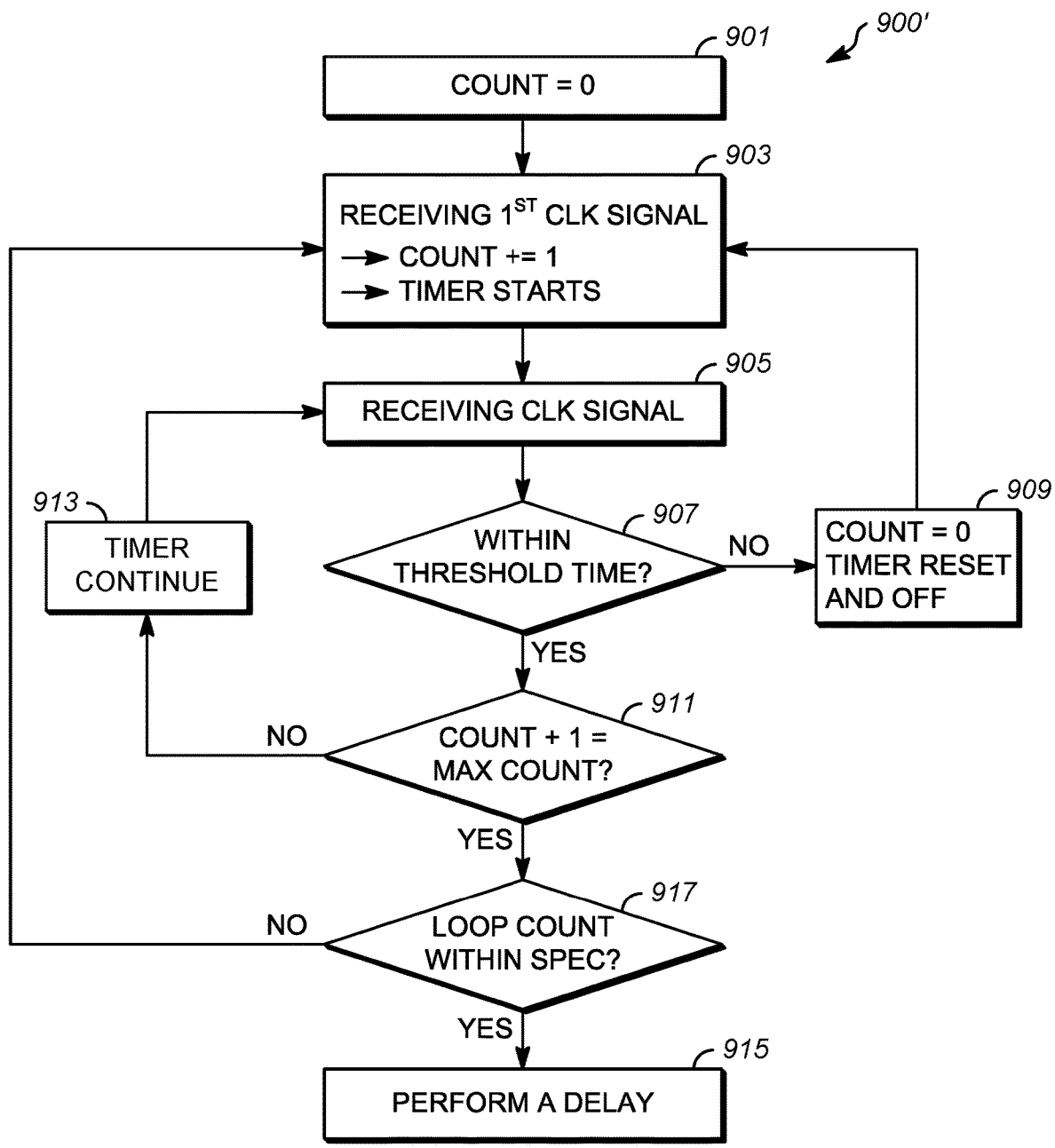
FIG. 9B depicts another flow chart for determining whether die program staggering is needed according to another example embodiment.

FIG. 9B shows a process flow 900' that is similar to the process flow 900 with an additional step. The same reference numbers in process flow 900 and 900' are designated with the same reference numbers. After the determination step 911 that increases the count and determines if the count is at the maximum count value, the step moves to step 917 whereat it determines if the loop count is within the specification value. If the loop count is not within the specification value, the process returns to step 903 to restart the process. If the loop count is within the specification value, the process proceeds to perform a delay, i.e. triggers a dynamic staggering of the operation of at least one memory die. The addition of step 917 allows for only certain types of counts to effect the count. This is due to only certain operational loops in the memory dies would add to the total current draw and possibly violate the maximum current draw. In an example embodiment, the control circuit is further configured to determine a loop count to determine if the number of times the plurality of memory dies have loped through a programming operation. This is done as the current peaks only occur in the middle of a programming loop. The loop count can be compared to a minimum value and a maximum value, e.g., $m \leq loop\ count \leq n$, where m is an integer for the low loop count and n is an integer for the high loop count. Loops can be operations of a programming operation. Loop counts below the integer m will not cause the peak current to be exceeded in any normal operating condition. Loop counts above the integer n will not cause the peak current to be exceeded in any normal operating condition. Accordingly, these operations that occur outside the specification will not require dynamic staggering to prevent exceeding the maximum current value.

Figure 10:
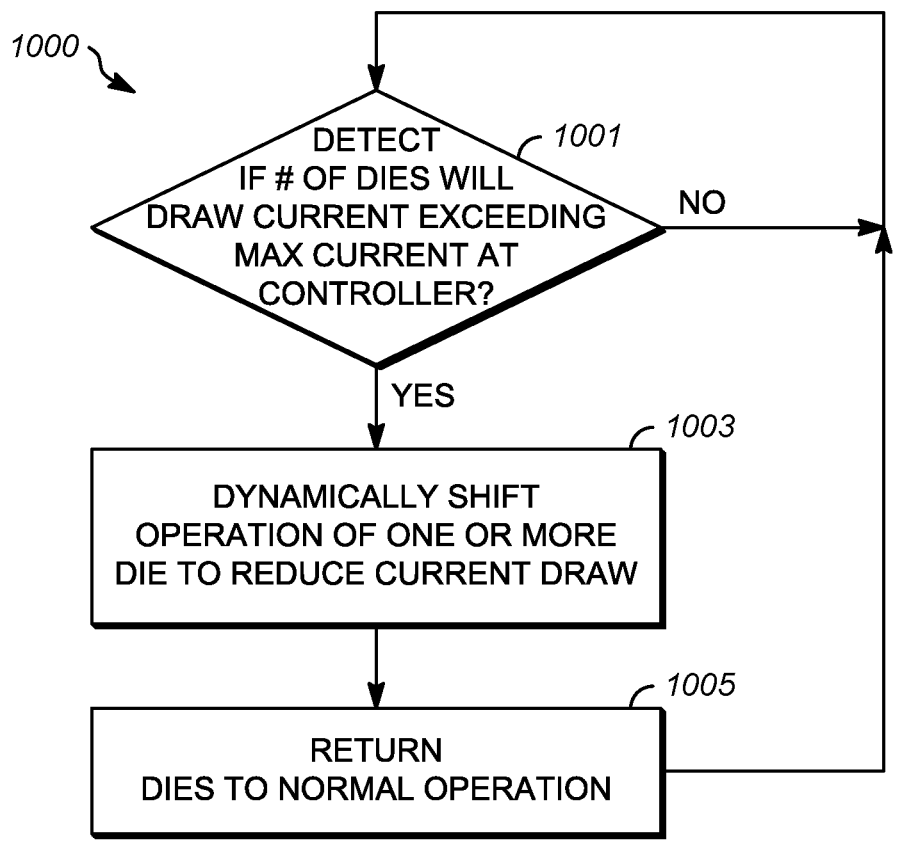
FIG. 10 depicts another flow chart for operating according to another example embodiment.

FIG. 10 shows a process flow 1000 for a memory system to dynamically stagger operation of group a memory dies such that the memory dies collectively do not exceed a maximum current draw from the current source for that group of memory dies or from a system current source.

At 1001, the number of dies performing a specific task is determined. This can be done at the controller, which receives the individual clock signal from the dies. Each memory die operates on its own clock signal. The controller can then decide whether to delay the operation of the one or more of the dies. For example, a single die operation can be delayed. Two dies can be delayed by a same delay time. More than dies, but less than all dies, can be delayed by a same delay time. In an example, two or more dies are delayed with at least two different delay times. This can prevent the dies from all performing a current intensive operation, e.g., program or program verify synchronously. Based on the received clock signals, the controller can prevent the dies from operating synchronously, which can prevent the total current draw for all dies from exceeding a maximum current draw. If the maximum current draw is exceeded, the voltage levels being supplied to the dies may not be held at a correct level or the time for a line to charge may be extended. This can cause operational errors in the group of dies. In an example embodiment, the dies contain nonvolatile memory, e.g., NAND or flash In an example embodiment, if multiple dies in the group are each performing a program or verify operation, the total current draw may exceed the maximum current draw that can be supplied to the plurality of dies in the group of dies.

In operation the controller can determine the operation state of each die based on the received clock signal from each die. The controller can set a delay for one or more dies and send a delay instruction to the one or more dies. The delay instruction to the dies can be for a same time delay or different time delays for one or more dies or each die. In an example, the time delay is a single clock cycle, two clock cycles or 2N clock cycles.

In an example of NAND memory dies, each die may draw about 90 milliamps for programming. In the case of eight memory dies, being operably connected to a controller, the peak current that can be supplied by the controller to the memory dies is about 800 milliamps, +/−5 milliamps or more, +/−10 milliamps or more. The current transferring the data on the data lines to be held in data latches at the memory dies can exceed 200 milliamps, e.g., about 229 milliamps or more. The Icc peak current draw for programming at each memory die can be about 90 milliamps. In this example, the total current draw for an eight memory dies system, the total current draw would be in excess of 900 milliamps (e.g., 949 milliamps) if all memory dies were programming at the same time. This exceeds the total peak current from the current source or controller operably connected to the dies. The present step 1001 determines if all of the dies or enough dies are performing a current intensive operation, e.g., programming, and if so whether these operations will exceed the maximum current that can be supplied by the host, controller or system. If the maximum current draw of all of the memory dies connected to the controller does not exceed the maximum current, the process 1000 continues to monitor operations. This can be performed in the memory controller indirectly by monitoring the clock signals at each of the memory dies. If the current draw will exceed the maximum current available, then the process proceeds to step 1003.

In an example embodiment, the controller receives a one-bit signal from the memory dies when the memory die is entering a certain operation, e.g., timing RR1. If all eight of the memory dies enter this state at the same time, then the memory controller, e.g., by counting the number of feedback data bits, the memory controller can determine that the current schedule of memory die operations will exceed the maximum current draw.

At 1003, the operation of one or more of the memory dies is dynamically staggered. Dynamic staggering is performed by shifting the operation of one or more dies in time, e.g., delaying the by one or two clock cycles for only a selected one or more of the memory dies. In an example embodiment, the dynamic staggering is only performed if the current draw will exceed the maximum current available from the controller. The controller will shift operation of the one or more memory dies such that the maximum current is not exceeded.

At 1005, the memory dies are returned to normal operation by removing the dynamic staggering of the one or more memory dies that were staggered in 1003.

In an example operation, the peak current limitation from the host or memory controller is about 800 mA at 2 μs. For NAND, e.g., BiCS, Icc peak while programming is typically about 90 mA at 2 μs. In a sequential write on an eight die package case, the programming Icc peak is about 720 mA. The transfer current (cache programming to achieve performance @ TM 1200 2 FIMs) is about 229 mA. Thus, the total Icc peak is about 949 mA at 2 μs smooth spec. Storing the data in data latches of the device without actually programming the data might be risky due to power failure that may be caused by exceeding the maximum current that can be supplied to the memory dies by the controller or the host. Many systems currently must store the data in the internal RAM to use the data in an XOR information until the data is verified—which may require a larger RAM.

Regarding the polling ready/busy—since the timing is not constant, the system must guess e.g., (use zero sigma value) to decide when to poll the NAND status in order to understand if the programming was done or not. When there are many dies in the package, checking all of them can be a very inefficient way to operate the memory system. Synchronization between dies also cannot guarantee the number of loops, therefore the system will have to check for status anyway. But once a die is ready—there is no need to check other dies, since you can guarantee that the peaks won't be aligned and therefore the system can immediately send the next program command (everything is very deterministic—so the power that will be used can be precisely predicted). In order to work within the host or controller power limitation, some systems compromise on performance, e.g., reducing TM speed for write operations, disabling cache programming when power might exceed the limitation or the like. While this example uses programming operations to illustrate that the operation of multiple dies with a single host or controller, different combinations of multiple memory die operations may result in high current peak, which may exceed the maximum current, as well. The present methodology seeks to optimize staggering duration for peak Icc reduction as well as negligible performance loss is critical for system product.

Figure 11A:
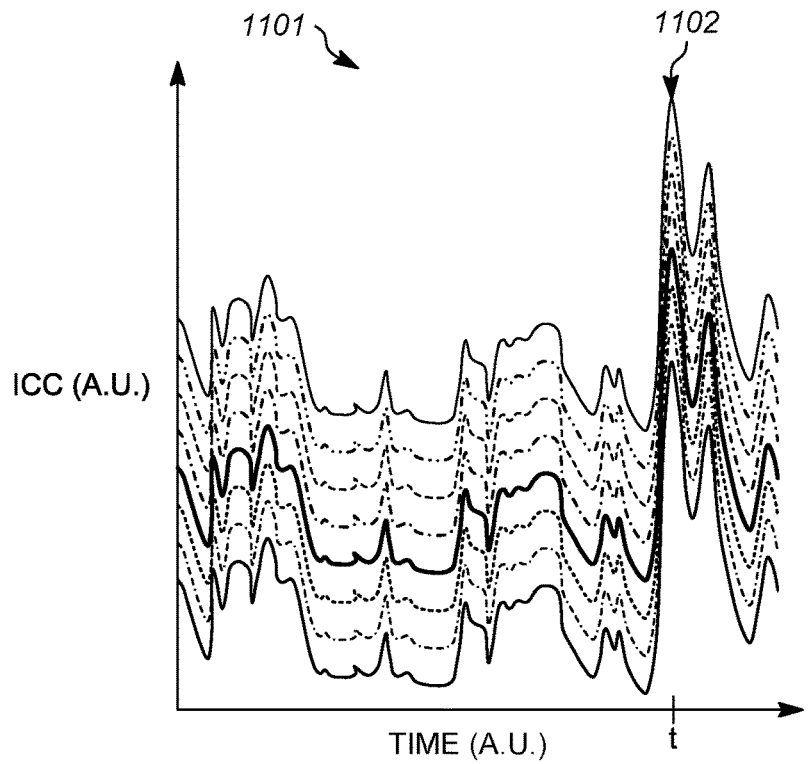
FIG. 11A depicts a timing diagram of current draw for a non-modified operation of a plurality of memory dies.

FIG. 11A shows a graph 1101 with the Icc current on a multimemory die system as a function of time. There is no counter measure to prevent excess current draw for this group of memory dies, which can share a same host or memory controller. At 1102, each of the dies draws a peak current Icc at time t. During a programming operation this can be at the P5 operation. This standard operation of the memory system with eight dies would require more current than could be supplied to the eight dies from the memory controller of the system. The peak Icc is an issue for this default operation as discussed herein due to the peaks occurring at the same time domain. This may result in memory storage errors.

Figure 11B:
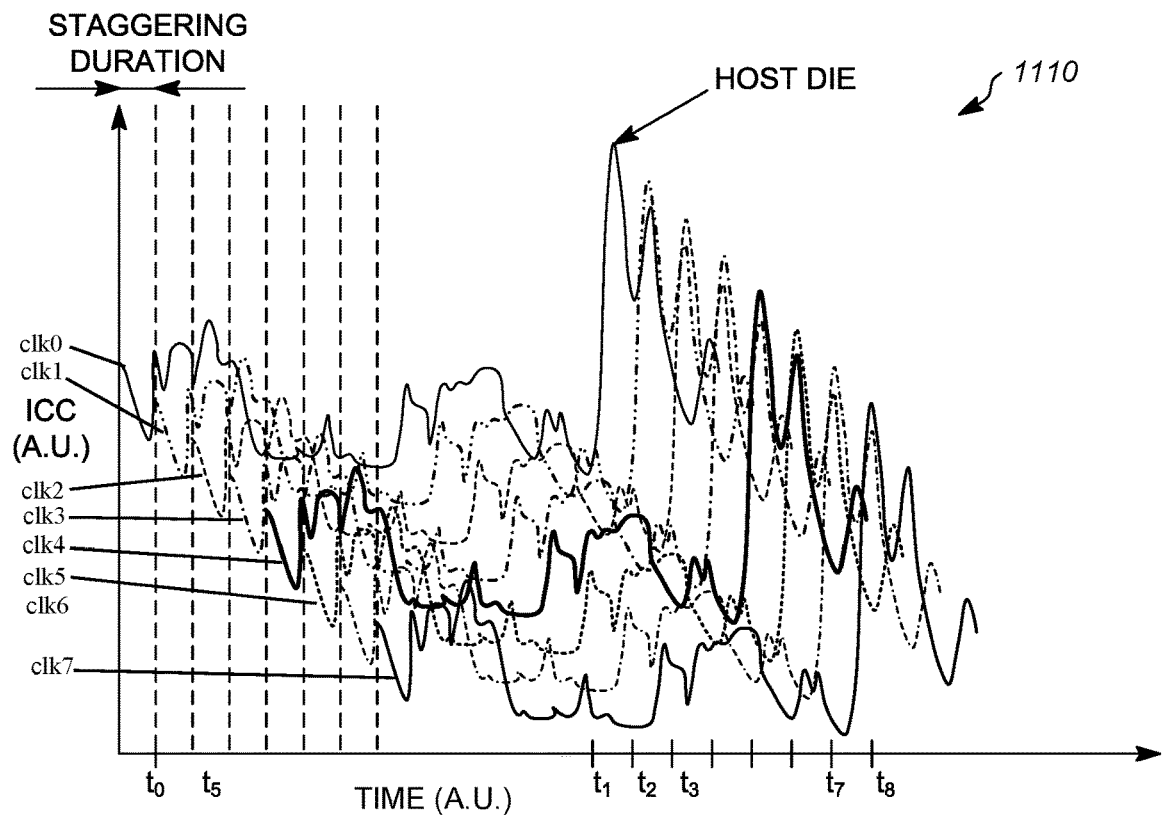
FIG. 11B depicts a timing diagram of current draw for a statically staggered operation of a plurality of memory dies.

FIG. 11B shows a graph 1110 with the Icc current on a multimemory die system as a function of time. Here, the memory dies are operated with a static staggering of die operations. That is, each die operation is staggered by a set amount, the staggering duration is shown from $t_0$ to $t_s$. Thus, the last die among eight dies begins its operation seven stagger durations after the first die begins. This is performed regardless of need. However, the current peaks for each memory die, which occur at $t_1$ for memory die 1, $t_2$ for memory die 2, $t_3$ for memory die 3, $t_4$ for memory die 4, $t_5$ for memory die 5, $t_6$ for memory die 6, $t_7$ for memory die 7, $t_8$ for memory die 8, are spaced from the current peaks of the other memory dies. This static staggering method requires clock synchronization of all of the dies. All dies need to know at least the clock information for the host die or all of the other clocks. The trade-off between peak power reduction vs. performance degradation is favorable. A blind static staggering of die operations at the beginning of program operation has demonstrated to be efficient based on emulation result for most of the events. However, it does not guarantee some rare case when peak alignment occurs at the middle of the program operation. Note that every memory die has different program verify counts in various program loops. Furthermore, the real system usage of NAND including program suspend for read operation makes static staggering for program operation becomes more complicate.

Figure 11C:
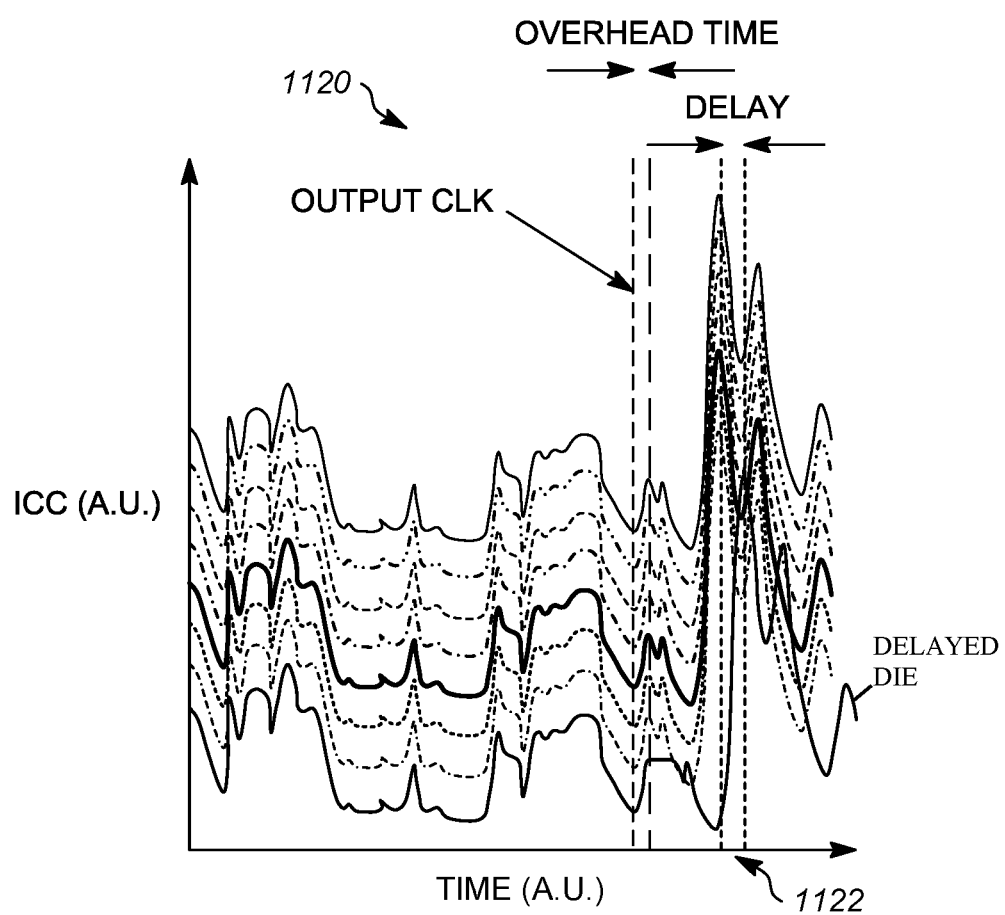
FIG. 11C depicts a timing diagrams of current draw for a dynamically staggered operation of a plurality of memory dies.

FIG. 11C shows a graph 1120 with the Icc current on a multimemory die system as a function of time and showing an embodiment of the present disclosure. The output clock from the memory dies is received at the memory controller and it imposes a slight overhead time 1122 to the timing diagram, e.g., less than or equal to two milliseconds. This allows the processes of 900, 900' of FIGS. 9A and 9B or FIG. 10 process to be performed. All dies output a single bit data when entering timing RR1. The controller counts if all memory dies (e.g., eight memory dies) RR1 signals appear within certain threshold time, e.g., the overhead time. If all are received within the threshold time, the memory controller can signal to instruct one or more die to delay and prevent current peak overlap. Thus, the memory controller can dynamically stagger some but not all memory dies to prevent the memory dies from exceeding the maximum current supply value.

In an example embodiment, delay decisions relative to the operation of the dies can be made, which reduces the likelihood that current draw by the dies would exceed the maximum current supplied to the memory dies. The controller can receive the clock signal from each of the memory dies and based on the clock received from each die, the controller can introduce at least one delay to the dies. In an example, the memory dies output their RR1 clock signals which are received at the controller during the RR3 clock (i.e., overhead time). The controller will store which the order and time of receipt of the RR1 signal for each die operably connected to the controller.

In an example embodiment, the eighth memory die is dynamically staggered relative to the other memory dies, e.g., delayed by the delay time. The delay time can be two milliseconds. The other seven memory dies an operate on their present clock timing. In another embodiment, two memory dies can be delayed. In another embodiment up to six memory dies can be delayed.

In an example embodiment, the dies send their clock signal to the controller. The dies operate on clocks that are independent from each other. The clocks are not synchronized to each other. Accordingly, the clock signals, e.g., RRT signal, arrive at the controller at their own time. The clocks signals, clk0-clk7, from the dies (0-7) arrive at the controller at different times. In an example embodiment, the order of arrival of the clocks signals at the controller is clk0, clk2, clk6, clk1, clk4, clk3, clk7, clk7. The controller can decide to assign a delay to one or more of the dies based on the received clock signals clk0-clk7. The controller can assign a first delay to the third die and a second delay to the seventh die by sending a delay signal to the respective dies. The times for the first delay and the second delay can be different times, e.g., the first delay is less than the second delay. The other dies can continue to operate on their own clock. The controller can send a delay signal to the dies that are being instructed to delay. The delay signal can include the length of the delay. In another example embodiment, the controller receives the clock signals from each of the dies and issues delay instructions to each of the dies. In another example embodiment, the controller receives the clock signals from each of the dies and assigns a delay to each die except the die associated with the first arriving clock signal clk0-clk7.

In another example embodiment, the order of arrival of the die clocks signals at the controller is clk0, clk2, clk6, clk1, clk4, clk3, clk5, and clk7. The controller can decide to assign a delay to one or more of the dies based on the received clock signals clk0-clk7. The controller can assign a same time delay to more than one die. The controller can assign a same time delay to each of dies 4, 3, 5, and 7. In this example, the first arriving clock signals clk0, clk2, clk6, clk1, clk4, are assigned to a first group. The later arriving clock signals clk4, clk3, clk5, clk7, are assigned to a second group. The first group are not assigned a delay by the controller. The second group are assigned a delay, e.g., a single clock cycle, two clock cycles or a multiple thereof, to delay the operation of the dies in the second group.

When comparing the graphs 1101, 1110, 1120, it is clear that the dynamic staggering as described herein is closer to default operation of graph 1101 as compared to the static staggering of graph 1110 in which all dies are delayed or all but the first is delayed from the preceding memory die.

Overall program operation has several program pulses (e.g., fourteen 14 loops in some examples, see FIG. 11C). Each loop has one program pulse and followed by one or several program verify operation. Peak Icc occurs during inhibit BL ramping (P5 or RR6 depends on parameter DYNAMIC_INH). It increases when programming loop increases to a half of total programming loop and then decreases till the end of program operation. It can be difficult to predict the verify number for each program loop before the whole program operation starts. However, after each program pulse, NAND notices the verify count by PCV signal. Moreover, when NAND enters RR clk, the occurrence of peak Icc is fixed. The present methodology can use this information to stagger some or all of the dies.

With the hardware design to output specific clk and loop count, the occurrence of eight die's peak Icc can be avoided by the controller as the dies do not have knowledge of the other dies clock signals or operation state. The controller can delay operation of one or more dies and shift the operation of the one or more dies to prevent the dies from synchronous operating. The controller can indirectly prevent the too much current draw just by using the die clock signals to prevent synchronous operation of the dies.

With the present system, there is no need to poll ready/busy for each die since the memory die will output the signal to the memory controller, which makes the present system more effective. There is no need to configure extra RAM in the memory dies. The present disclosure may operate to prevent well alignment of peak Icc for all memory dies joined as a group with a single memory controller or single current source.

Aspects of the present disclosure can be embodied as an apparatus, system, method, or computer program product. Accordingly, aspects of the present disclosure can take the form of an entirely hardware embodiment, an entirely software embodiment (including firmware, resident software, micro-code, or the like) or an embodiment combining software and hardware aspects that can all generally be referred to herein as a "circuit," "module," "apparatus," or "system." Furthermore, aspects of the present disclosure can take the form of a computer program product embodied in one or more non-transitory computer readable storage media storing computer readable and/or executable program code.

Many of the functional units described in this specification have been labeled as modules in order to more particularly emphasize their implementation independence. For example, a module can be implemented as a hardware circuit comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices, or the like.

Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a controller;
a plurality of memory dies operably connected to and controlled by the controller, wherein each of the memory dies draws a current from a current source during a program operation; and
the controller being configured to:
receive clock signals from the memory dies, each clock signal being associated with a time point, which is a fixed time before peak current demand during the program operation of a corresponding memory die;
count a number of the clock signals received by the controller within a threshold time to determine a count value of memory dies that will hit peak current demand within the threshold time; and
dynamically stagger the corresponding program operation of at least one of the memory dies relative to the corresponding program operation of at least one other of the memory dies when the count value reaches a maximum count value within the threshold time to reduce total peak current demand by the memory dies.

2. The apparatus of claim 1, wherein the controller is configured to reset the count value to zero when the threshold time has elapsed.

3. The apparatus of claim 2, wherein the controller is further configured to restart a timer counting out the threshold time when a new clock signal is received.

4. The apparatus of claim 3, wherein the timer count starts at the threshold time and counts down to zero.

5. The apparatus of claim 4, wherein the controller is further configured to determine a loop count for each memory die of the plurality of memory dies to determine a number of times each memory die of the plurality of memory dies has looped through the programming operation.

6. The apparatus of claim 5, wherein, for each memory die, the controller compares the loop count versus a minimum loop value and a maximum loop value and the loop count must be between or equal to one of the minimum loop value and the maximum loop value to trigger dynamic staggering.

7. The apparatus of claim 6, wherein the controller is further configured to receive the corresponding loop count and the corresponding clock signal from each memory die over a communication bus.

8. The apparatus of claim 1 wherein the maximum count value is equal to a number of the plurality of memory dies.

9. The apparatus of claim 1, wherein the controller is configured to dynamically stagger a first memory die of the plurality of memory dies with a first delay and a second memory die of the plurality of memory dies with a second delay, and the first delay is different than the second delay.

10. A dynamic staggering method for nonvolatile memory, comprising:
receiving, at a memory controller operably connected to a plurality of memory dies, clock signals that each indicate a programming operation at a corresponding memory die of the plurality of memory dies;
starting a timer upon receipt of a first clock signal from a first memory die of the plurality of memory dies;
counting a number of the clock signals from the plurality of memory dies received by the memory controller within a threshold time of the timer, each clock signal being associated with a time point, which is a fixed time before peak current demand during the programming operation of the corresponding memory die;
determining if the counted number of the clock signals exceeds a maximum count within the threshold time;
if the counted number of the clock signals does not exceed the maximum count within the threshold time, performing previously scheduled operations on each of the plurality of memory dies; and
if the counted number of the clock signals exceeds the maximum count within the threshold time, dynamically staggering the corresponding program operation of at least one memory die of the plurality of memory dies relative to at least one other memory die at least one other memory die of the plurality of memory dies to prevent the plurality of memory dies from operating synchronously during programming operations of the memory dies.

11. The method of claim 10, further comprising resetting the counted number of the clock signals to zero when the threshold time has elapsed.

12. The method of claim 11, wherein starting the timer includes starting the timer at the threshold time and counting down to zero.

13. The method of claim 10, further comprising determining a loop count for each memory die of the plurality of memory dies.

14. The method of claim 13, wherein determining the loop count for each memory die further includes comparing the loop count versus a minimum loop value and a maximum loop value and the loop count must be between or equal to one of the minimum loop value and the maximum loop value to trigger dynamic staggering.

15. A circuit for operating a plurality of memory dies, comprising:
 a bus configured to connect with a plurality of memory dies and wherein clock signals can be received via the bus from the plurality of memory dies, each clock signal being associated with a time point, which is a fixed time before peak current demand during a programming operation of a corresponding memory die of the plurality of memory dies;
 control circuitry configured to:
  count the number of the clock signals received within a threshold time to determine a count value, and
  communicate a signal via the bus to dynamically stagger the corresponding program operation of at least one of the memory dies relative to the corresponding program operation of at least one other memory die of the plurality of memory dies when the count value reaches a maximum count value within a threshold time.

16. The circuit as set forth in claim 15, wherein the circuit is further configured to reset the count value to zero when the threshold time has elapsed.

17. The circuit as set forth in claim 16, wherein the circuit is further configured to restart a timer counting out the threshold time when a new clock signal is received.

18. The circuit as set forth in claim 17, wherein the timer count starts at the threshold time and counts down to zero.

* * * * *